(12) United States Patent
Herrick et al.

(10) Patent No.: US 7,598,144 B2
(45) Date of Patent: Oct. 6, 2009

(54) METHOD FOR FORMING INTER-POLY DIELECTRIC IN SHIELDED GATE FIELD EFFECT TRANSISTOR

(75) Inventors: Robert Herrick, Lehi, UT (US); Dean Probst, West Jordan, UT (US); Fred Session, Sandy, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 116 days.

(21) Appl. No.: 11/952,481

(22) Filed: Dec. 7, 2007

(65) Prior Publication Data

US 2008/0090339 A1    Apr. 17, 2008

Related U.S. Application Data

(62) Division of application No. 11/201,400, filed on Aug. 9, 2005, now Pat. No. 7,385,248.

(51) Int. Cl.
*H01L 21/336* (2006.01)
*H01L 21/76* (2006.01)

(52) U.S. Cl. .............. 438/272; 438/270; 438/425; 438/454; 257/E21.177

(58) Field of Classification Search .......... 438/270, 438/272, 425, 454; 257/E21.177
See application file for complete search history.

(56) References Cited

U.S. PATENT DOCUMENTS

| | | |
|---|---|---|
| 3,404,295 A | 10/1968 | Warner et al. |
| 3,412,297 A | 11/1968 | Amlinger |
| 3,497,777 A | 2/1970 | Teszner et al. |
| 3,564,356 A | 2/1971 | Wilson |
| 3,660,697 A | 5/1972 | Berglund et al. |
| 4,003,072 A | 1/1977 | Matsushita et al. |
| 4,011,105 A | 3/1977 | Paivinen et al. |
| 4,300,150 A | 11/1981 | Colak |
| 4,324,038 A | 4/1982 | Chang et al. |

(Continued)

FOREIGN PATENT DOCUMENTS

DE     4300806 C1    12/1993

(Continued)

OTHER PUBLICATIONS

Baliga "New Concepts in Power Rectifiers," Physics of Semiconductor Devices, Proceedings of the Third Int'l Workshop, Madras (India), Committee on Science and Technology in Developing Countries (1985), pp. 471-481.

(Continued)

*Primary Examiner*—Ngan Ngo
(74) *Attorney, Agent, or Firm*—Townsend and Townsend and Crew LLP (57) ABSTRACT

A method of forming shielded gate trench FET includes the following steps. A trench is formed in a silicon region of a first conductivity type. A shield electrode is formed in a bottom portion of the trench. An inter-poly dielectric (IPD) including a layer of thermal oxide and a layer of conformal dielectric is formed along an upper surface of the shield electrode. A gate dielectric lining at least upper trench sidewalls is formed. A gate electrode is formed in the trench such that the gate electrode is insulated from the shield electrode by the IPD.

31 Claims, 5 Drawing Sheets

U.S. PATENT DOCUMENTS

| | | | |
|---|---|---|---|
| 4,326,332 A | 4/1982 | Kenney et al. |
| 4,337,474 A | 6/1982 | Yukimoto |
| 4,345,265 A | 8/1982 | Blanchard |
| 4,445,202 A | 4/1984 | Goetze et al. |
| 4,568,958 A | 2/1986 | Baliga |
| 4,579,621 A | 4/1986 | Hine |
| 4,636,281 A | 1/1987 | Buiguez et al. |
| 4,638,344 A | 1/1987 | Cardwell, Jr. |
| 4,639,761 A | 1/1987 | Singer et al. |
| 4,673,962 A | 6/1987 | Chatterjee et al. |
| 4,698,653 A | 10/1987 | Cardwell, Jr. |
| 4,716,126 A | 12/1987 | Cogan |
| 4,745,079 A | 5/1988 | Pfiester |
| 4,746,630 A | 5/1988 | Hui et al. |
| 4,754,310 A | 6/1988 | Coe |
| 4,767,722 A | 8/1988 | Blanchard |
| 4,774,556 A | 9/1988 | Fujii et al. |
| 4,801,986 A | 1/1989 | Chang et al. |
| 4,821,095 A | 4/1989 | Temple |
| 4,823,176 A | 4/1989 | Baliga et al. |
| 4,824,793 A | 4/1989 | Richardson et al. |
| 4,853,345 A | 8/1989 | Himelick |
| 4,868,624 A | 9/1989 | Grung et al. |
| 4,893,160 A | 1/1990 | Blanchard |
| 4,914,058 A | 4/1990 | Blanchard |
| 4,941,026 A | 7/1990 | Temple |
| 4,961,100 A | 10/1990 | Baliga et al. |
| 4,967,245 A | 10/1990 | Cogan et al. |
| 4,969,028 A | 11/1990 | Baliga |
| 4,974,059 A | 11/1990 | Kinzer |
| 4,975,782 A | 12/1990 | Bauer |
| 4,990,463 A | 2/1991 | Mori |
| 4,992,390 A | 2/1991 | Chang |
| 5,027,180 A | 6/1991 | Nishizawa et al. |
| 5,034,785 A | 7/1991 | Blanchard |
| 5,065,273 A | 11/1991 | Rajeevakumar |
| 5,071,782 A | 12/1991 | Mori |
| 5,072,266 A | 12/1991 | Bulucea |
| 5,079,608 A | 1/1992 | Wodarczyk et al. |
| 5,105,243 A | 4/1992 | Nakagawa et al. |
| 5,111,253 A | 5/1992 | Korman et al. |
| 5,134,448 A | 7/1992 | Johnsen et al. |
| 5,142,640 A | 8/1992 | Iwanatsu |
| 5,156,989 A | 10/1992 | Williams et al. |
| 5,164,325 A | 11/1992 | Cogan et al. |
| 5,164,802 A | 11/1992 | Jones et al. |
| 5,168,331 A | 12/1992 | Yilmaz |
| 5,168,973 A | 12/1992 | Asayama et al. |
| 5,188,973 A | 2/1993 | Omura et al. |
| 5,208,657 A | 5/1993 | Chatterjee et al. |
| 5,216,275 A | 6/1993 | Chen |
| 5,219,777 A | 6/1993 | Kang |
| 5,219,793 A | 6/1993 | Cooper et al. |
| 5,233,215 A | 8/1993 | Baliga |
| 5,242,845 A | 9/1993 | Baba et al. |
| 5,250,450 A | 10/1993 | Lee et al. |
| 5,262,336 A | 11/1993 | Pike, Jr. et al. |
| 5,268,311 A | 12/1993 | Euen et al. |
| 5,275,961 A | 1/1994 | Smayling et al. |
| 5,275,965 A | 1/1994 | Manning |
| 5,281,548 A | 1/1994 | Prall |
| 5,283,201 A | 2/1994 | Tsang et al. |
| 5,294,824 A | 3/1994 | Okada |
| 5,298,781 A | 3/1994 | Cogan et al. |
| 5,300,447 A | 4/1994 | Anderson |
| 5,300,452 A | 4/1994 | Chang et al. |
| 5,326,711 A | 7/1994 | Malhi |
| 5,346,834 A | 9/1994 | Hisamoto et al. |
| 5,350,937 A | 9/1994 | Yamazaki et al. |
| 5,365,102 A | 11/1994 | Mehrotra et al. |
| 5,366,914 A | 11/1994 | Takahashi et al. |
| 5,389,815 A | 2/1995 | Takahashi |
| 5,405,794 A | 4/1995 | Kim |
| 5,418,376 A | 5/1995 | Muraoka et al. |
| 5,424,231 A | 6/1995 | Yang |
| 5,429,977 A | 7/1995 | Lu et al. |
| 5,430,311 A | 7/1995 | Murakami et al. |
| 5,430,324 A | 7/1995 | Bencuya |
| 5,434,435 A | 7/1995 | Baliga |
| 5,436,189 A | 7/1995 | Beasom |
| 5,438,007 A | 8/1995 | Vinal et al. |
| 5,438,215 A | 8/1995 | Tihanyi |
| 5,442,214 A | 8/1995 | Yang |
| 5,473,176 A | 12/1995 | Kakumoto |
| 5,473,180 A | 12/1995 | Ludikhuize |
| 5,474,943 A | 12/1995 | Hshieh et al. |
| 5,488,010 A | 1/1996 | Wong |
| 5,519,245 A | 5/1996 | Tokura et al. |
| 5,532,179 A | 7/1996 | Chang et al. |
| 5,541,425 A | 7/1996 | Nishihara |
| 5,554,552 A | 9/1996 | Chi |
| 5,554,862 A | 9/1996 | Omura et al. |
| 5,567,634 A | 10/1996 | Hebert et al. |
| 5,567,635 A | 10/1996 | Acovic et al. |
| 5,572,048 A | 11/1996 | Sugawara |
| 5,576,245 A | 11/1996 | Cogan et al. |
| 5,578,851 A | 11/1996 | Hshieh et al. |
| 5,581,100 A | 12/1996 | Ajit |
| 5,583,065 A | 12/1996 | Miwa |
| 5,592,005 A | 1/1997 | Floyd et al. |
| 5,593,909 A | 1/1997 | Han et al. |
| 5,595,927 A | 1/1997 | Chen et al. |
| 5,597,765 A | 1/1997 | Yilmaz et al. |
| 5,605,852 A | 2/1997 | Bencuya |
| 5,616,945 A | 4/1997 | Williams |
| 5,623,152 A | 4/1997 | Majumdar et al. |
| 5,629,543 A | 5/1997 | Hshieh et al. |
| 5,637,898 A | 6/1997 | Baliga |
| 5,639,676 A | 6/1997 | Hshieh et al. |
| 5,640,034 A | 6/1997 | Malhi |
| 5,648,670 A | 7/1997 | Blanchard |
| 5,656,843 A | 8/1997 | Goodyear et al. |
| 5,665,619 A | 9/1997 | Kwan et al. |
| 5,670,803 A | 9/1997 | Beilstein, Jr. et al. |
| 5,684,320 A | 11/1997 | Kawashima |
| 5,689,128 A | 11/1997 | Hshieh et al. |
| 5,693,569 A | 12/1997 | Ueno |
| 5,705,409 A | 1/1998 | Witek |
| 5,710,072 A | 1/1998 | Krautschneider et al. |
| 5,714,781 A | 2/1998 | Yamamoto et al. |
| 5,717,237 A | 2/1998 | Chi |
| 5,719,409 A | 2/1998 | Singh et al. |
| 5,744,372 A | 4/1998 | Bulucea |
| 5,767,004 A | 6/1998 | Balasubramanian et al. |
| 5,770,878 A | 6/1998 | Beasom |
| 5,776,813 A | 7/1998 | Huang et al. |
| 5,780,343 A | 7/1998 | Bashir |
| 5,801,417 A | 9/1998 | Tsang et al. |
| 5,814,858 A | 9/1998 | Williams |
| 5,821,583 A | 10/1998 | Hshieh et al. |
| 5,877,528 A | 3/1999 | So |
| 5,879,971 A | 3/1999 | Witek |
| 5,879,994 A | 3/1999 | Kwan et al. |
| 5,894,157 A | 4/1999 | Han et al. |
| 5,895,951 A | 4/1999 | So et al. |
| 5,895,952 A | 4/1999 | Darwish et al. |
| 5,897,343 A | 4/1999 | Mathew et al. |
| 5,897,360 A | 4/1999 | Kawaguchi |
| 5,900,663 A | 5/1999 | Johnson et al. |
| 5,906,680 A | 5/1999 | Meyerson |
| 5,907,776 A | 5/1999 | Hshieh et al. |
| 5,917,216 A | 6/1999 | Floyd et al. |
| 5,929,481 A | 7/1999 | Hshieh et al. |
| 5,943,581 A | 8/1999 | Lu et al. |

| | | | | | | |
|---|---|---|---|---|---|---|
| 5,949,104 | A | 9/1999 | D'Anna et al. | 6,271,100 B1 | 8/2001 | Ballantine et al. |
| 5,949,124 | A | 9/1999 | Hadizad et al. | 6,271,552 B1 | 8/2001 | D'Anna |
| 5,959,324 | A | 9/1999 | Kohyama | 6,271,562 B1 | 8/2001 | Deboy et al. |
| 5,960,271 | A | 9/1999 | Wollesen et al. | 6,274,904 B1 | 8/2001 | Tihanyi |
| 5,972,741 | A | 10/1999 | Kubo et al. | 6,274,905 B1 | 8/2001 | Mo |
| 5,973,360 | A | 10/1999 | Tihanyi | 6,277,706 B1 | 8/2001 | Ishikawa |
| 5,973,367 | A | 10/1999 | Williams | 6,281,547 B1 | 8/2001 | So et al. |
| 5,976,936 | A | 11/1999 | Miyajima et al. | 6,285,060 B1 | 9/2001 | Korec et al. |
| 5,977,591 | A | 11/1999 | Fratin et al. | 6,291,298 B1 | 9/2001 | Williams et al. |
| 5,981,344 | A | 11/1999 | Hshieh et al. | 6,291,856 B1 | 9/2001 | Miyasaka et al. |
| 5,981,996 | A | 11/1999 | Fujishima | 6,294,818 B1 | 9/2001 | Fujihira |
| 5,998,833 | A | 12/1999 | Baliga | 6,297,534 B1 | 10/2001 | Kawaguchi et al. |
| 6,005,271 | A | 12/1999 | Hshieh | 6,303,969 B1 | 10/2001 | Tan |
| 6,008,097 | A | 12/1999 | Yoon et al. | 6,307,246 B1 | 10/2001 | Nitta et al. |
| 6,011,298 | A | 1/2000 | Blanchard | 6,309,920 B1 | 10/2001 | Laska et al. |
| 6,015,727 | A | 1/2000 | Wanlass | 6,313,482 B1 | 11/2001 | Baliga |
| 6,020,250 | A | 2/2000 | Kenney et al. | 6,316,806 B1 | 11/2001 | Mo |
| 6,034,415 | A | 3/2000 | Johnson et al. | 6,326,656 B1 | 12/2001 | Tihanyi |
| 6,037,202 | A | 3/2000 | Witek | 6,331,466 B1 | 12/2001 | Takahashi et al. |
| 6,037,628 | A | 3/2000 | Huang | 6,337,499 B1 | 1/2002 | Werner |
| 6,037,632 | A | 3/2000 | Omura et al. | 6,346,464 B1 | 2/2002 | Takeda et al. |
| 6,040,600 | A | 3/2000 | Uenishi et al. | 6,346,469 B1 | 2/2002 | Greer |
| 6,048,772 | A | 4/2000 | D'Anna | 6,351,018 B1 | 2/2002 | Sapp |
| 6,049,108 | A | 4/2000 | Williams et al. | 6,353,252 B1 | 3/2002 | Yasuhara et al. |
| 6,051,488 | A | 4/2000 | Lee et al. | 6,359,308 B1 | 3/2002 | Hijzen et al. |
| 6,057,558 | A | 5/2000 | Yamamoto et al. | 6,362,112 B1 | 3/2002 | Hamerski |
| 6,063,678 | A | 5/2000 | D'Anna | 6,362,505 B1 | 3/2002 | Tihanyi |
| 6,064,088 | A | 5/2000 | D'Anna | 6,365,462 B2 | 4/2002 | Baliga |
| 6,066,878 | A | 5/2000 | Neilson | 6,365,930 B1 | 4/2002 | Schillaci et al. |
| 6,069,043 | A | 5/2000 | Floyd et al. | 6,368,920 B1 | 4/2002 | Beasom |
| 6,077,733 | A | 6/2000 | Chen et al. | 6,368,921 B1 | 4/2002 | Hijzen et al. |
| 6,081,009 | A | 6/2000 | Neilson | 6,376,314 B1 | 4/2002 | Jerred |
| 6,084,264 | A | 7/2000 | Darwish | 6,376,315 B1 | 4/2002 | Hshieh et al. |
| 6,084,268 | A | 7/2000 | de Frésart et al. | 6,376,878 B1 | 4/2002 | Kocon |
| 6,087,232 | A | 7/2000 | Kim et al. | 6,376,890 B1 | 4/2002 | Tihanyi |
| 6,096,608 | A | 8/2000 | Williams | 6,384,456 B1 | 5/2002 | Tihanyi |
| 6,097,063 | A | 8/2000 | Fujihira | 6,388,286 B1 | 5/2002 | Baliga |
| 6,103,578 | A | 8/2000 | Uenishi et al. | 6,388,287 B2 | 5/2002 | Deboy et al. |
| 6,103,619 | A | 8/2000 | Lai | 6,400,003 B1 | 6/2002 | Huang |
| 6,104,054 | A | 8/2000 | Corsi et al. | 6,426,260 B1 | 7/2002 | Hshieh |
| 6,110,799 | A | 8/2000 | Huang | 6,429,481 B1 | 8/2002 | Mo et al. |
| 6,114,727 | A | 9/2000 | Ogura et al. | 6,433,385 B1 | 8/2002 | Kocon et al. |
| 6,137,152 | A | 10/2000 | Wu | 6,436,779 B2 | 8/2002 | Hurkx et al. |
| 6,150,697 | A | 11/2000 | Teshigahara et al. | 6,437,399 B1 | 8/2002 | Huang |
| 6,156,606 | A | 12/2000 | Michaelis | 6,441,454 B2 | 8/2002 | Hijzen et al. |
| 6,156,611 | A | 12/2000 | Lan et al. | 6,444,574 B1 | 9/2002 | Chu |
| 6,163,052 | A | 12/2000 | Liu et al. | 6,452,230 B1 | 9/2002 | Boden, Jr. |
| 6,165,870 | A | 12/2000 | Shim et al. | 6,461,918 B1 | 10/2002 | Calafut |
| 6,168,983 | B1 | 1/2001 | Rumennik et al. | 6,465,304 B1 | 10/2002 | Blanchard et al. |
| 6,168,996 | B1 | 1/2001 | Numazawa et al. | 6,465,843 B1 | 10/2002 | Hirler et al. |
| 6,171,935 | B1 | 1/2001 | Nance et al. | 6,465,869 B2 | 10/2002 | Ahlers et al. |
| 6,174,769 | B1 | 1/2001 | Lou | 6,472,678 B1 | 10/2002 | Hshieh et al. |
| 6,174,773 | B1 | 1/2001 | Fujishima | 6,472,708 B1 | 10/2002 | Hshieh et al. |
| 6,174,785 | B1 | 1/2001 | Parekh et al. | 6,475,884 B2 | 11/2002 | Hshieh et al. |
| 6,184,545 | B1 | 2/2001 | Werner et al. | 6,476,443 B1 | 11/2002 | Kinzer |
| 6,184,555 | B1 | 2/2001 | Tihanyi et al. | 6,479,352 B2 | 11/2002 | Blanchard |
| 6,188,104 | B1 | 2/2001 | Choi et al. | 6,489,652 B1 | 12/2002 | Jeon et al. |
| 6,188,105 | B1 | 2/2001 | Kocon et al. | 6,501,146 B1 | 12/2002 | Harada |
| 6,190,978 | B1 | 2/2001 | D'Anna | 6,534,825 B2 | 3/2003 | Calafut |
| 6,191,447 | B1 | 2/2001 | Baliga | 6,566,804 B1 | 5/2003 | Trujillo et al. |
| 6,194,741 | B1 | 2/2001 | Kinzer et al. | 6,580,123 B2 | 6/2003 | Thapar |
| 6,198,127 | B1 | 3/2001 | Kocon | 6,608,350 B2 | 8/2003 | Kinzer et al. |
| 6,201,279 | B1 | 3/2001 | Pfirsch | 6,657,254 B2 | 12/2003 | Hshieh et al. |
| 6,204,097 | B1 | 3/2001 | Shen et al. | 6,677,641 B2 | 1/2004 | Kocon |
| 6,207,994 | B1 | 3/2001 | Rumennik et al. | 6,683,346 B2 | 1/2004 | Zeng |
| 6,222,229 | B1 | 4/2001 | Hebert et al. | 6,720,616 B2 | 4/2004 | Hirler et al. |
| 6,222,233 | B1 | 4/2001 | D'Anna | 6,734,066 B2 | 5/2004 | Lin et al. |
| 6,225,649 | B1 | 5/2001 | Minato | 6,762,127 B2 | 7/2004 | Boiteux et al. |
| 6,228,727 | B1 | 5/2001 | Lim et al. | 6,806,533 B2 | 10/2004 | Henninger et al. |
| 6,239,463 | B1 | 5/2001 | Williams et al. | 6,833,584 B2 | 12/2004 | Henninger et al. |
| 6,239,464 | B1 | 5/2001 | Tsuchitani et al. | 6,870,220 B2 * | 3/2005 | Kocon et al. .............. 257/340 |
| 6,265,269 | B1 | 7/2001 | Chen et al. | 7,005,353 B2 * | 2/2006 | Kocon et al. .............. 438/270 |
| 6,271,082 | B1 | 8/2001 | Hou et al. | 7,238,586 B2 | 7/2007 | Hsu et al. |

| | | | |
|---|---|---|---|
| 7,385,248 | B2 | 6/2008 | Herrick et al. |
| 2001/0023961 | A1 | 9/2001 | Hshieh et al. |
| 2001/0026989 | A1 | 10/2001 | Thapar |
| 2001/0028083 | A1 | 10/2001 | Onishi et al. |
| 2001/0032998 | A1 | 10/2001 | Iwamoto et al. |
| 2001/0041400 | A1 | 11/2001 | Ren et al. |
| 2001/0049167 | A1 | 12/2001 | Madson |
| 2001/0050394 | A1 | 12/2001 | Onishi et al. |
| 2002/0008284 | A1 | 1/2002 | Zeng |
| 2002/0009832 | A1 | 1/2002 | Blanchard |
| 2002/0014658 | A1 | 2/2002 | Blanchard |
| 2002/0066924 | A1 | 6/2002 | Blanchard |
| 2002/0070418 | A1 | 6/2002 | Kinzer et al. |
| 2002/0100933 | A1 | 8/2002 | Marchant |
| 2003/0060013 | A1 | 3/2003 | Marchant |
| 2003/0132450 | A1 | 7/2003 | Minato et al. |
| 2003/0193067 | A1 | 10/2003 | Kim |
| 2003/0209757 | A1 | 11/2003 | Henninger et al. |
| 2004/0031987 | A1 | 2/2004 | Henninger et al. |
| 2004/0089910 | A1 | 5/2004 | Hirler et al. |
| 2004/0121572 | A1 | 6/2004 | Darwish et al. |
| 2004/0232407 | A1 | 11/2004 | Calafut |
| 2005/0017293 | A1 | 1/2005 | Zundel et al. |
| 2005/0167742 | A1 | 8/2005 | Challa et al. |
| 2009/0111231 | A1* | 4/2009 | Grebs et al. ................ 438/270 |

FOREIGN PATENT DOCUMENTS

| | | |
|---|---|---|
| DE | 19736981 A1 | 8/1998 |
| EP | 0975024 A2 | 1/2000 |
| EP | 1026749 A1 | 8/2000 |
| EP | 1054451 A2 | 11/2000 |
| EP | 0747967 B1 | 2/2002 |
| EP | 1205980 A1 | 5/2002 |
| JP | 56-058267 A | 5/1981 |
| JP | 62-069562 | 3/1987 |
| JP | 63-186475 | 8/1988 |
| JP | 63-288047 | 11/1988 |
| JP | 64-022051 | 1/1989 |
| JP | 01-192174 A | 8/1989 |
| JP | 05-226638 A | 9/1993 |
| JP | 2000-040822 | 2/2000 |
| JP | 2000-040872 | 2/2000 |
| JP | 2000-156978 A | 6/2000 |
| JP | 2000-277726 A | 10/2000 |
| JP | 2000-277728 A | 10/2000 |
| JP | 2001-015448 | 1/2001 |
| JP | 2001-015752 | 1/2001 |
| JP | 2001-102577 A | 4/2001 |
| JP | 2001-111041 A | 4/2001 |
| JP | 2001-135819 A | 5/2001 |
| JP | 2001-144292 A | 5/2001 |
| JP | 2001-244461 A | 9/2001 |
| JP | 2001-313391 A | 12/2001 |
| JP | 2002-083976 A | 3/2002 |
| WO | WO 00/33386 A2 | 6/2000 |
| WO | WO 00/68997 A1 | 11/2000 |
| WO | WO 00/68998 A1 | 11/2000 |
| WO | WO 00/75965 A2 | 12/2000 |
| WO | WO 01/06550 A1 | 1/2001 |
| WO | WO 01/06557 A1 | 1/2001 |
| WO | WO 01/45155 A1 | 6/2001 |
| WO | WO 01/59847 A2 | 8/2001 |
| WO | WO 01/71815 | 9/2001 |
| WO | WO 01/95385 A1 | 12/2001 |
| WO | WO 01/95398 A1 | 12/2001 |
| WO | WO 02/01644 A2 | 1/2002 |
| WO | WO 02/47171 A1 | 6/2002 |
| WO | WO 2007/021701 A2 | 2/2007 |

OTHER PUBLICATIONS

Baliga "Options for CVD of Dielectrics Include Low-k Materials," Technical Literature from Semiconductor International, Jun. 1998, 4 pages total.

Baliga et al., "Improving the reverse recovery of power MOSFET integral diodes by electron irradiation," (Dec. 1983) *Solid State Electronics*, vol. 26, No. 12, pp. 1133-1141.

Brown et al. Novel Trench Gate Structure Developments Set the Benchmark for Next Generation Power MOSFET Switching Performance. Power Electronics—May 2003 Proceedings (PCIM), Nurenburg, vol. 47, pp. 275-278.

Bulucea "Trench DMOS Transistor Technology For High Current (100 A Range) Switching" Solid-State Electronics vol. 34 No. pp. 493-507 (1991).

Change et al. "Numerical and experimental Analysis of 500-V Power DMOSFET with an Atomic-Lattice Layout," IEEE Transactions on Electron Devices 36:2623 (1989).

Chang et al. "Self-Aligned UMOSFET's with a Specific On-Resistance of 1mΩ cm$^2$," IEEE Transactions on Electron Devices 34:2329-2334 (1987).

Cheng et al., "Fast reverse recovery body diode in high-voltage VDMOSFET using cell-distrubuted schottky contacts," (May 2003) *IEEE Transactions on Electron Devices*, vol. 50, No. 5, pp. 1422-1425.

"CoolMOS™ the second generation," Infineon Technologies product information, (2000), 2 pages total.

Curtis, et al. "APCVD TEOS: 03 Advanced Trench Isolation Applications," Semiconductor Fabtech 9th Edition (1999) 8 pages total.

Darwish et al. A New Power W-Gated Trench MOSFET (WMOSFET) with High Switching Performance. ISPSD Proceedings—Apr. 2003, Cambridge, 4 pages total.

Djekic, O. et al., "High frequency synchronous buck converter for low voltage applications," (1998) *Proc. IEEE Power Electronics Specialist Conf.* (*PESC*), pp. 1248-1254.

Fujihira "Theory of Semiconductor Superjunction Devices" Jpn. J. Appl. Phys. vol. 36 pp. 6254-6262 (1997).

Gan et al. "Poly Flanked VDMOS (PFVDMOS): A Superior Technology for Superjunction Devices," IEEE Power Electronics Specialists Conference, Jun. 17-22, 2001, Vancouver, Canada (2001), 4 pages total.

Glenn et al. "A Novel Vertical Deep Trench Resurf DMOS (VTR-DMOS)" IEEE ISPD 2000, May 22-25, Toulouse France, pp. 197-200.

"IR develops CoolMOS™-equivalent technology, positions it at the top of a 3-tiered line of new products for SMPS," International Rectifiers company information available at http://www.irf.com (1999) 3 pages total.

Kao et al. "Two Dimensional Thermal Oxidation of Silicon-I. Experiments,", *IEEE Transactions on Electron Devices*, vol. ED-34, No. 5, May 1987, pp. 1008-1017.

Kao et al. "Two Dimensional Thermal Oxidation of Silicon-II. Modeling Stress Effects in Wet Oxides," *IEEE Transactions on Electron Devices*, vol. ED-35, No. 1, Jan. 1988, pp. 25-37.

Kassakian, J.G. et al., "High-frequency high-density converters for distributed power supply systems," (Apr. 1988) *Proceedings of the IEEE*, vol. 76, No. 4, pp. 362-376.

Korman, C.S. et al., "High performance power DMOSFET with integrated schottky diode," (1989) *Proc. IEEE Power Electronics Specialist Conf.* (*PESC*), pp. 176-179.

Lorenz et al., "Cool MOS- An important milestone towards a new power MOSFET generation" Power Conversion pp. 151-160 (1988).

Maksimovic, A.M. et al., "Modeling and simulation of power electronic converters," (Jun. 2001) *Proceedings of the IEEE*, vol. 89, No. 6, pp. 898-912.

Mehrotra, M. et al., "Very low forward drop JBS rectifiers fabricated using submicron technology," (Nov. 1993) *IEEE Transactions on Electron Devices*, vol. 40, No. 11, pp. 2131-2132.

Miller, "Power Management & Supply—Market, Applications Technologies—an Overview," Infineon Technologies, downloaded from the internet <<http://www.ewh.ieee.org/r8/germany/ias-pels/m_regensburg/overview_miller.pdf>>, May 5, 2003, 53 pages total.

Moghadam "Delivering Value Around New Industry Paradigms," Technical Literature from Applied Materials, pp. 1-11, vol. 1, Issue 2, Nov. 1999.

Park et al., "Lateral Trench Gate Super-Junction SOI-LDMOSFETs with Low On-Resistance," Institute for Microelectronics, University of Technology Vienna, Austria (2002), pp. 283-285.

Sakai et al., "Experimental investigation of dependence of electrical characteristics of device parameters in trench MOS barrier, schottky diodes," (1998) *International Symposium on Power Semiconductors and ICs, Technical Digest*, pp. 293-296.

Shenai et al., "Current transport mechanisms in atomically abrupt metal-semiconductor interfaces," (Apr. 1988) *IEEE Transactions on Electron Devices*, vol. 35, No. 4, pp. 468-482.

Shenai et al., "Monolithically integrated power MOSFET and schottky diode with improved reverse recovery characteristics," (Apr. 1990) *IEEE Transactions on Electron Devices*, vol. 37, No. 4, pp. 1167-1169.

Shenoy et al."Analysis of the Effect of Charge Imbalance on the Static and Dynamic Characteristic of the Super Junction MOSFET," IEEE International Symposium on Power Semiconductor Devices 1999, pp. 99-102 (1999).

Singer "Empty Spaces in Silicon (ESS): An Alternative to SOI," Semiconductor International p. 42, Dec. 1999.

Tabisz et al., "A MOSFET resonant synchronous rectifier for high-frequency dc/dc converters," (1990) *Proc. IEEE Power Electronics Specialist Conf.* (PESC), pp. 769-779.

Technical Literature from Quester Technology, Model APT-4300 300mm Atmospheric TEOS/Ozone CVD System, (unknown date), 3 pages total.

Technical Literature from Quester Technology, Model APT-6000 Atmospheric TEOS-Ozone CVD System, (unknown date), 2 pages total.

Technical Literature from Silicon Valley Group Thermal Systems, APNext, High Throughput APCVD Cluster Tool for 200 mm/300 mm Wafer Processing, (unknown date), 2 pages total.

Tu et al. "On the reverse blocking characteristics of schottky power diodes," (Dec. 1992) *IEEE Transactions on Electron Devices*. vol. 39, No. 12, pp. 2813-2814 2 pages total.

Ueda et al. "An Ultra-Low On-Resistance Power MOSFET Fabricated by Using a Fully Self-Aligned Process," IEEE Transactions on Electron Devices 34:926-930 (1987).

Wilamowski "Schottky Diodes with High Breakdown Voltages," Solid-State Electronics 26:491-493 (1983).

Wolf et al., "Silicon Processing for The VLSI Era" vol. 1—Process Technology, Second Edition, (1990), pp. 658.

Wolf, "Silicon Processing for The VLSI Era" vol. 2 Process Integration Lattice Press (1990), 3 pages total.

Yamashita et al., Conduction Power loss in MOSFET synchronous rectifier with parallel-connected schottky barrier diode, (Jul. 1998) *IEEE Transactions on Power electronics*, vol. 13, No. 4, pp. 667-673.

International Preliminary Report on Patentability of Feb. 12, 2008 for International Application No. PCT/US06/30944.

International Search Report of Apr. 16, 2007 for International Application No. PCT/US06/30944.

Written Opinion of Apr. 16, 2007 for International Application No. PCT/US06/30944.

* cited by examiner

METHOD FOR FORMING INTER-POLY DIELECTRIC IN SHIELDED GATE FIELD EFFECT TRANSISTOR

CROSS-REFERENCES TO RELATED APPLICATIONS

This application is a division of U.S. application Ser. No. 11/201,400, filed Aug. 9, 2005, which is incorporated by reference in its entirety for all purposes.

BACKGROUND OF THE INVENTION

The invention relates in general to semiconductor power field effect transistors (FETs), and more particularly to a structure and method for forming an improved inter-poly dielectric (IPD) in a shielded gate FET.

Figure 1:
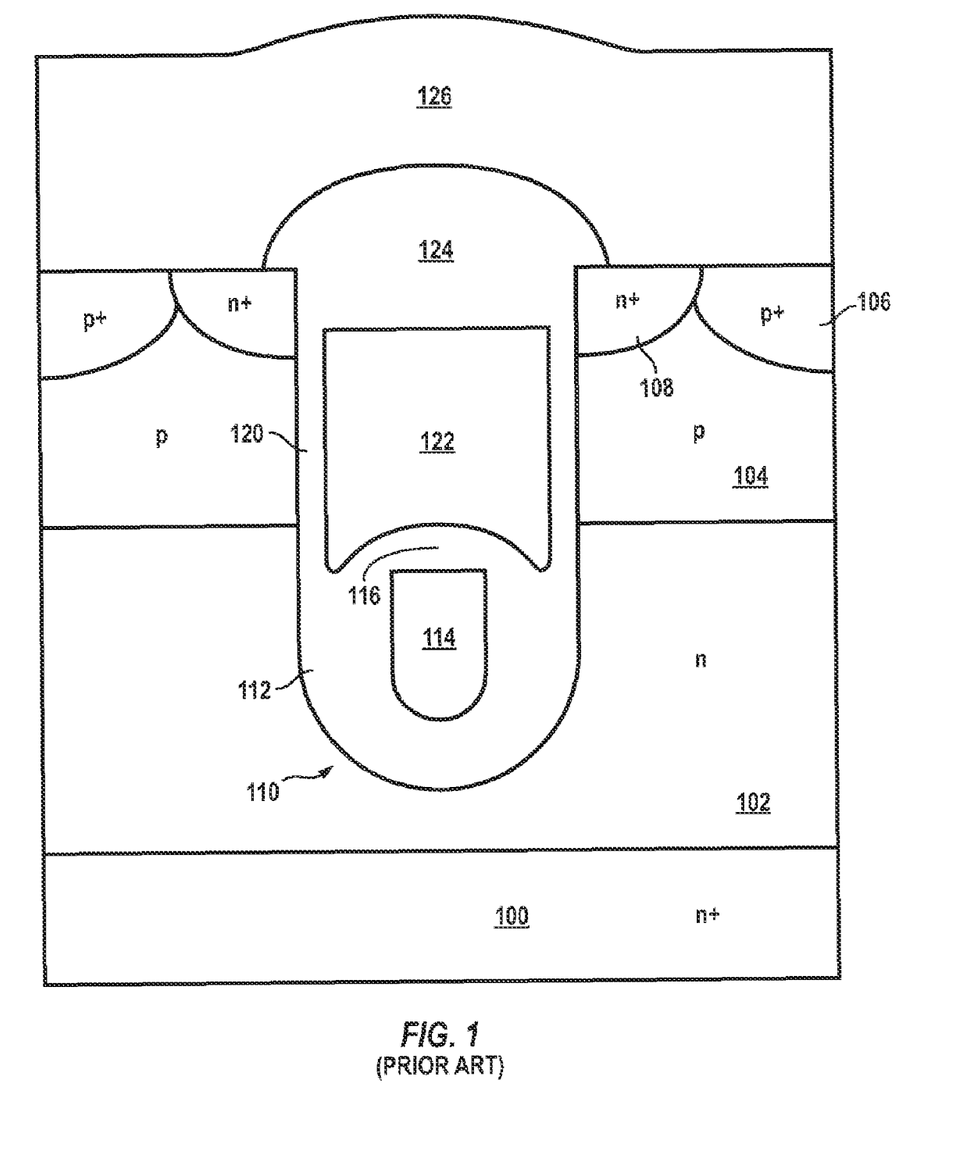
FIG. 1 is a simplified cross section view of a conventional shielded gate trench MOSFET.

Shielded gate trench FETs are advantageous in that the shield electrode reduces the gate-drain capacitance (Cgd) and improves the breakdown voltage of the transistor. FIG. 1 is a simplified cross section view of a conventional shielded gate trench MOSFET. Trench 110 includes a shield electrode 114 directly below a gate electrode 122. Shield electrode 114 is insulated from adjacent silicon regions by a shield dielectric 112 which is generally thicker than gate dielectric 120. The gate and shield electrodes are insulated from one another by a dielectric layer 116 commonly referred to as inter-poly dielectric or IPD. The IPD layer must be of sufficient quality and thickness to support the required voltage between the gate and shield electrodes.

The conventional shielded gate FET of FIG. 1 suffers from a number of drawbacks. First, gate electrode 122 has sharp bottom corners which together with the flat top surface of shield electrode 114 leads to high electric fields in these regions. Second, conventional methods for forming the IPD typically introduce an oxide layer on the mesas between trenches that must be removed at some point after the gate electrode has been formed. In removing this oxide some etching of the gate oxide down the trench sidewalls inevitably occurs, which may result in gate shorts and gate leakage. Other known techniques tie formation of the IPD to formation of the gate dielectric and thus the IPD thickness is limited to a set multiple of the gate dielectric thickness. This does not allow independent optimization of the gate dielectric and the IPD. The largest differential in thickness between the IPD and the gate dielectric achieved has been about three to one (i.e., for a given target gate dielectric thickness, the largest IPD thickness that has been achieved is about three times greater than that of the target gate dielectric thickness).

Thus, there is a need for a structure and method of forming a shielded gate trench FET with improved IPD and gate dielectric.

BRIEF SUMMARY OF THE INVENTION

In accordance with an embodiment of the invention, a method of forming a FET includes the following steps. A trench is formed in a silicon region of a first conductivity type. A shield electrode is formed in a lower portion of the trench. An inter-poly dielectric (IPD) including a layer of thermal oxide and a layer of conformal dielectric is formed along an upper surface of the shield electrode. A gate dielectric lining at least upper trench sidewalls is formed. A gate electrode is formed in the trench. The gate electrode is insulated from the shield electrode by the IPD.

In one embodiment, the IPD has a concave upper surface.

In another embodiment, a ratio of a thickness of the IPD to a thickness of the gate dielectric is greater than three to one.

In yet another embodiment, the gate dielectric is formed after forming the IPD.

In another embodiment, the IPD is formed as follows. A layer of thermal oxide is formed along upper sidewalls of the trench and along an upper surface of the shield electrode. The trench is filled with a conformal layer of dielectric. The conformal layer of dielectric and the layer of thermal oxide are partially removed such that the IPD comprising a remaining portion of the thermal dielectric layer and a remaining portion of the conformal layer of dielectric is formed.

In accordance with another embodiment of the invention, a FET includes a trench extending into a silicon region of a first conductivity type. A shield electrode insulated from the silicon region by a shield dielectric extends in a lower portion of the trench. A gate electrode is in the trench over, but insulated from, the shield electrode by an inter-poly dielectric (IPD). The IPD comprises a conformal layer of dielectric and a thermal oxide layer.

In one embodiment, the gate electrode is insulated from the silicon region by a gate dielectric extending along upper trench sidewalls, and a ratio of a thickness of the IPD to a thickness of the gate dielectric is greater than three to one.

In another embodiment, the IPD has a concave profile along its upper surface.

In yet another embodiment, the gate electrode has a concave profile along its lower surface.

In another embodiment, the conformal layer of dielectric is surrounded by the thermal dielectric along its lower surface and sidewalls.

In another embodiment, the conformal layer of dielectric has a convex lower surface and a concave upper surface.

In another embodiment, the shield electrode has a rounded top surface.

In another embodiment, the silicon region includes an epitaxial layer of the first conductivity type extending over a substrate of the first conductivity type, well regions of a second conductivity type in the epitaxial layer, and source regions of the first conductivity in the well regions. The source regions flank the trench.

In one embodiment, the trench extends into and terminates within the epitaxial layer.

In another embodiment, the trench extends through the epitaxial layer and terminates within the substrate.

The following detailed description and the accompanying drawings provide a better understanding of the nature and advantages of the present invention.

DETAILED DESCRIPTION OF THE INVENTION

In accordance with the present invention, an IPD layer of a shielded gate FET is formed by performing a thermal oxidation followed by deposition of a conformal layer of dielectric. A gate dielectric is then formed, followed by formation of the gate electrode. This method decouples the process for forming the IPD layer from that for forming the gate dielectric, enabling each of these dielectric layers to be independently optimized. A high quality, thick IPD can thus be formed to support the required voltage between the gate and shield electrodes without compromising the gate dielectric quality or thickness. Further, the conformal layer of dielectric helps obtain a smooth concave profile (i.e., like the inside of a bowl) along the top surface of the IPD which in turn results in a smooth bottom profile for the gate electrode. This helps reduce the electric field as compared to the conventional FET structure in FIG. 1 where the gate electrode has sharp lower corners.

Figure 2A:
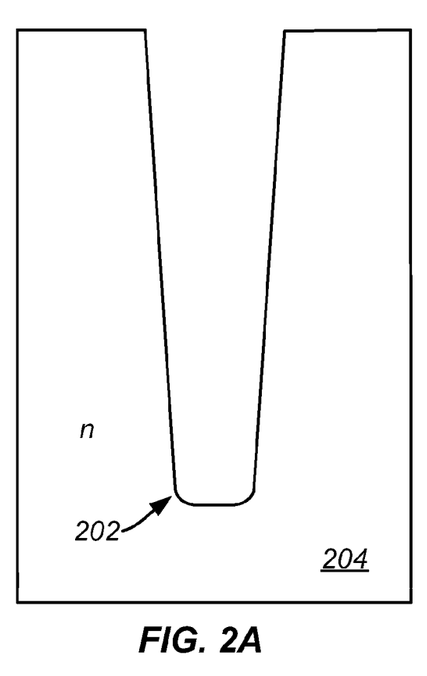
FIGS. 2A-2L are simplified cross section views at various stages of an exemplary process sequence for forming a shielded gate trench FET with improved inter-poly dielectric and gate dielectric, in accordance with an embodiment of the invention.
Figure 2B:
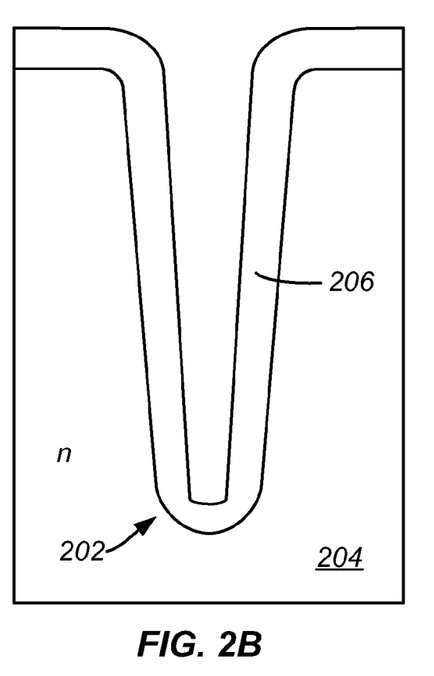

FIGS. 2A-2L are simplified cross section views at various stages of an exemplary process sequence for forming a shielded gate trench FET with improved IPD and gate dielectric, in accordance with an embodiment of the invention. In FIG. 2A, a trench 202 is formed in silicon region 204 using conventional masking and silicon etch techniques. In one embodiment, silicon region 204 comprises a relatively lightly doped n-type epitaxial layer extending over a highly conductive n-type substrate. In this embodiment, depending on the design goals, the trench can be etched to terminate within the epitaxial layer or extend deeper to terminate within the substrate. In FIG. 2B, a shield dielectric layer 206 (e.g., comprising oxide) lining the trench sidewalls and bottom as well as the surface of the mesa regions adjacent the trench is formed using known techniques. In one embodiment, the shield oxide is formed using high temperature (e.g., 1,150° C.) dry oxidation. The high temperature helps round out the trench bottom corners and form about 1,250 Å of shield oxide sufficient to support device breakdown.

Figure 2C:
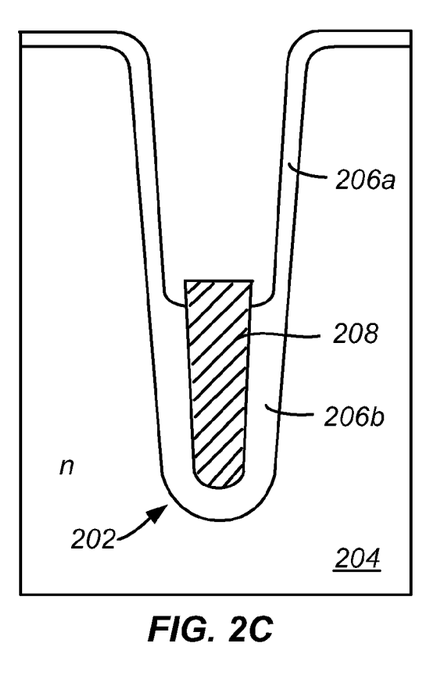

In FIG. 2C, a layer of polysilicon is deposited to fill the trench using conventional polysilicon deposition techniques. The deposited polysilicon is then recessed into the trench to thereby form shield electrode 208. The exposed portions of the shield dielectric layer are then thinned down, to for example 650 Å. In an embodiment where the shield electrode comprises oxide, a wet buffered oxide etch is used to thin down the shield oxide. The remaining exposed portion 206a of the shield dielectric helps prevent excessive growth of oxide along the trench sidewalls and mesa surfaces in the subsequent thermal oxidation step, and helps control the profile of the trenched cavity. Excessive growth of thermal oxide can lead to formation of voids in the subsequent deposited conformal dielectric. In one embodiment, the exposed portions of shield dielectric 206 are completely removed or alternatively the entire shield dielectric 206 is left intact.

Figure 2D:
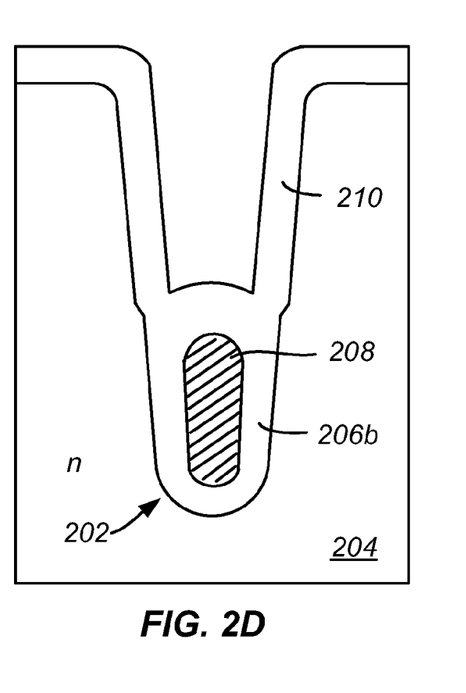

In FIG. 2D, a thermal oxidation step is carried out to form a thermal oxide layer 210 along the trench sidewalls, over the surface of the mesa regions adjacent the trench, and over shield electrode 208. The thermal oxidation advantageously oxidizes an upper portion of shield electrode 208 resulting in a rounded-top profile. The rounded top helps minimize electric field in the regions between shield electrode 208 and the gate electrode formed later. In one embodiment, thermal oxide layer 210 is formed by performing a low temperature, wet oxidation followed by a high temperature, dry oxidation. In another embodiment, the thermal oxidation yields a thermal oxide layer 210 with a thickness in the range of 1000-1500 Å. In yet another embodiment, a low temperature thermal oxidation (e.g., about 850° C.) is carried out so that a thicker thermal oxide layer is formed along the top surface of the shield electrode than along the trench sidewalls and over the mesa surfaces. In such embodiment, a thickness ratio in the range of 1.5:1 to 2:1 would be desirable. In one specific embodiment, the thermal oxidation yields a thermal oxide layer having a thickness of about 1,850 Å along the top surface of the shield electrode and a thickness of about 1,250 Å along the trench sidewalls and the mesa surfaces.

Figure 2E:
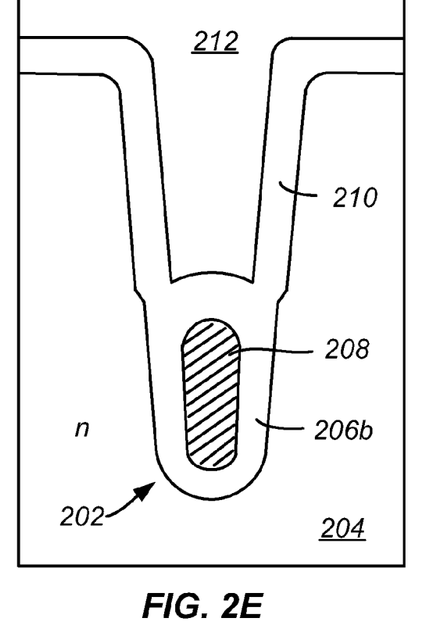

In FIG. 2E, a conformal layer of dielectric 212 (e.g., comprising oxide) is deposited to fill the trench. In one embodiment, conformal dielectric layer 212 is deposited using a sub-atmospheric chemical vapor deposition (SACVD) tetra-ethylorthosilicate (TEOS)/Ozone process at a temperature of about 510° C. and pressure of about 480 Torr. The deposited oxide fills the trench completely without voiding.

Figure 2F:
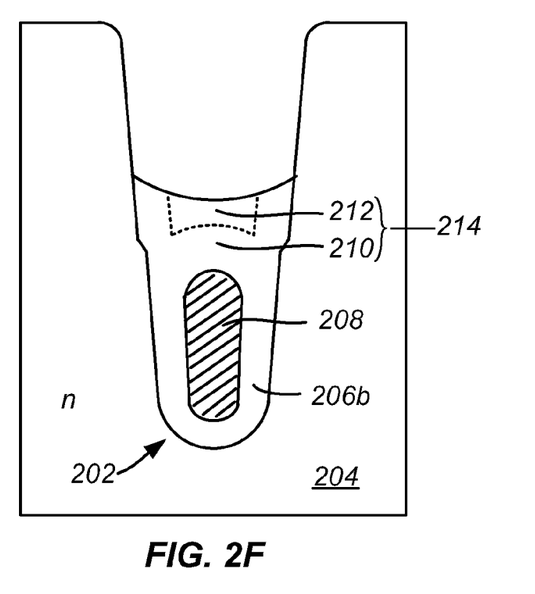

In FIG. 2F, conformal dielectric layer 212 and thermal oxide layer 210 are etched down into the trench to the desired depth. All the dielectric over the mesa surfaces and along upper trench sidewalls is completely removed, and an inter-poly dielectric (IPD) layer 214 having a concave top surface remains over shield electrode 208. IPD layer 214 thus comprises a stack of thermal dielectric layer and conformal dielectric layer. In one embodiment, a uniform etch back of the dielectric stack is carried out in recessing the dielectric stack into the trench. A dry anisotropic plasma etch or a wet etch can be carried out to achieve the desired thickness for the IPD and to ensure that the oxide along the trench sidewalls and over the mesa is completely removed. A conventional densification step can also be carried out to densify the SACVD oxide. In one embodiment, a dry etch and a subsequent densification are carried out, followed by a wet etch.

Figure 2G:
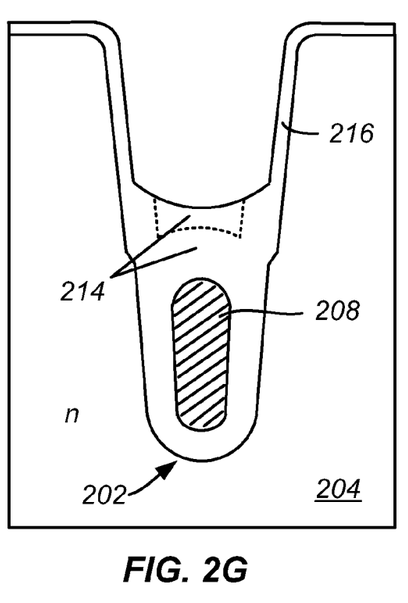
Figure 2H:
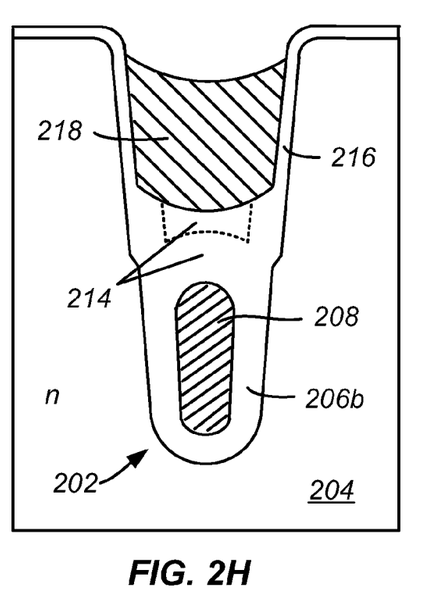

In FIG. 2G, a gate dielectric layer 216 (e.g., from oxide) extending along trench sidewalls, over the IPD layer, and over the mesa regions adjacent the trench is formed using conventional techniques. Because the IPD formation is completely decoupled from the gate dielectric formation, the gate dielectric can be independently optimized to have the desired characteristics. In FIG. 2H, using conventional techniques, a layer of polysilicon is deposited to fill the trench, and is then etched back to form a recessed gate electrode 218 in trench 202.

Figure 2I:
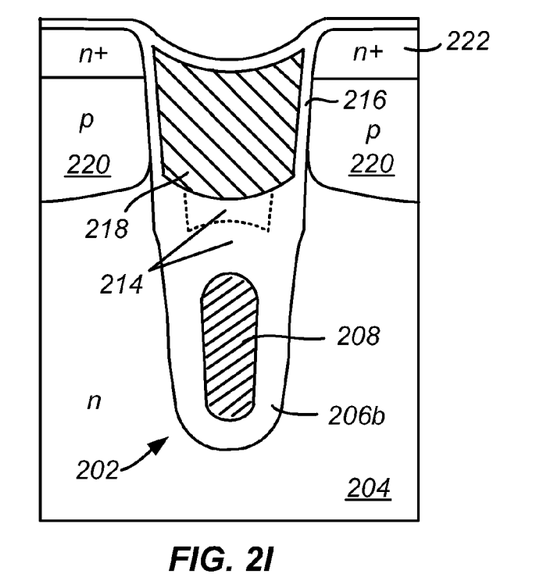
Figure 2J:
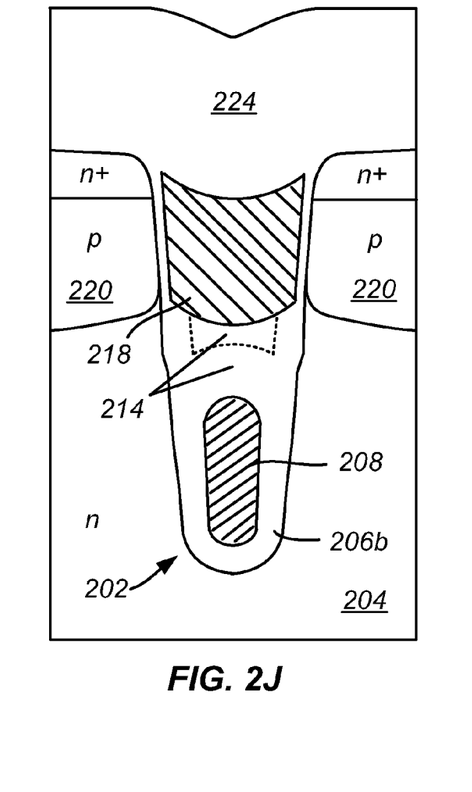
Figure 2K:
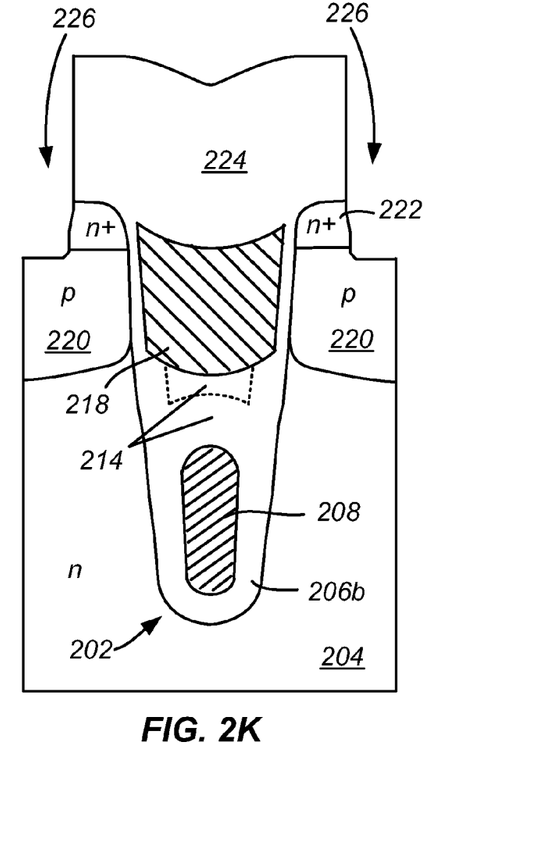

In FIG. 2I, the portion of gate dielectric 216 extending over the mesa is etched back to a thickness suitable for body implant and source implant. A conventional blanket body implant and drive in process is performed to form p-type body regions 220 along an upper portion of silicon region 204. A conventional source implant together with a masking layer (not shown) is then used to form source regions 222 flanking trench 202. In FIG. 2J, a dielectric layer 224 (e.g., comprising BPSG) is formed over the structure using conventional techniques. In FIG. 2K, using a masking layer (not shown), dielectric layer 224 is partially removed to expose surfaces of body regions 220 and source regions 222 as defined by the masking layer. A conventional silicon etch (e.g., dry etch) is then carried out to recess the exposed surface regions. The recessed silicon regions thus form contact openings 226.

Figure 2L:
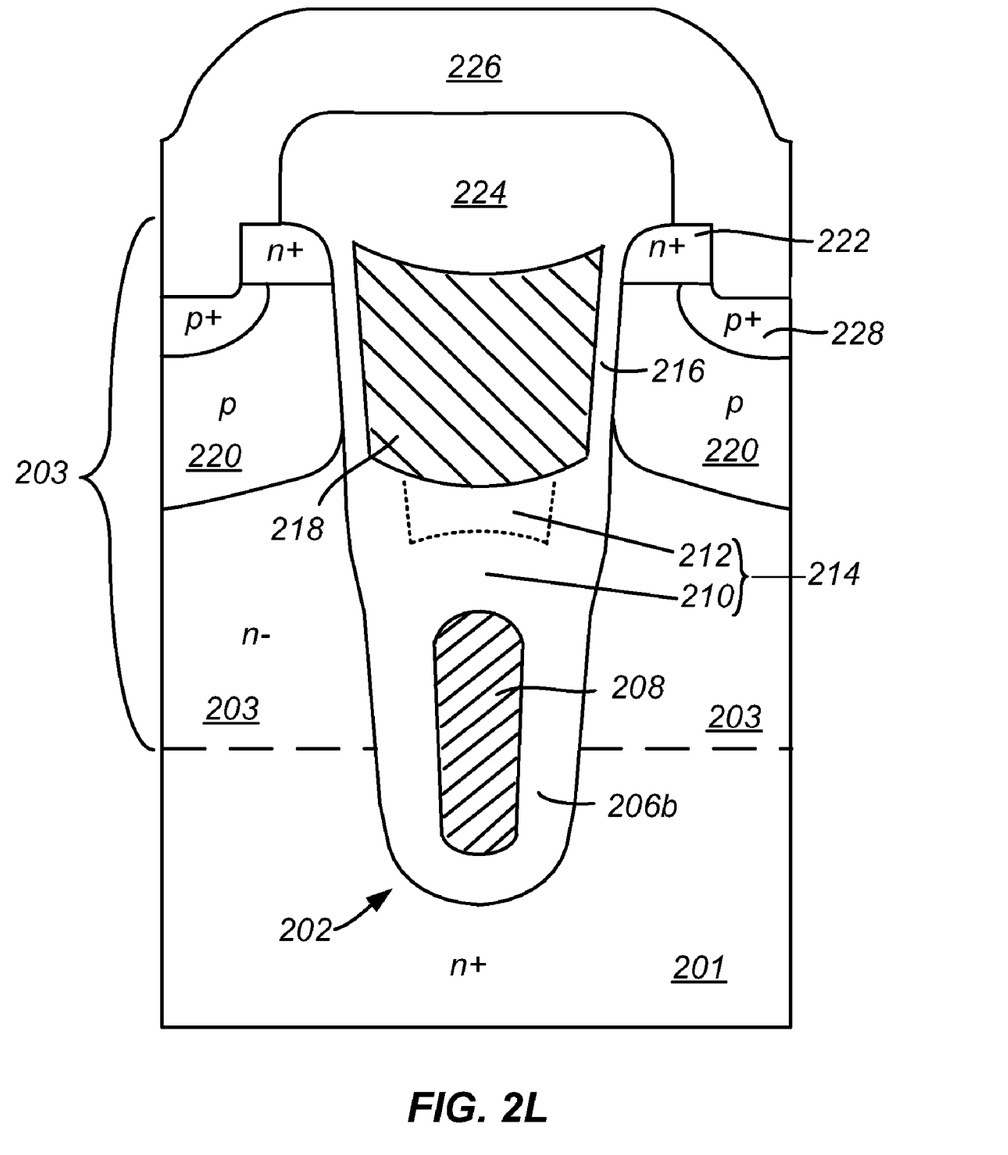

In FIG. 2L, a blanket heavy body implant is carried out to form self-aligned p-type heavy body regions 228 in body regions 220. A reflow of dielectric 224 is then carried out to obtain a better aspect ratio for the contact openings and a better step coverage for a metal layer 226 which is formed in a subsequent step to electrically contact heavy body regions 228 and source regions 222. A horizontally extending dashed line is included in FIG. 2L to illustrate the embodiment wherein an epitaxial layer 203 extends over a substrate 201, and trench 202 extends through epitaxial layer 203 and terminates in substrate 201. Alternatively, trench 202 may be terminated within epitaxial layer 203. Also, the process sequence depicted by cross section views in FIGS. 2A-2L is merely exemplary and the various steps can be modified or carried out in a different sequence than that shown. In particular, any one of a number of known process steps can be carried out instead of those depicted by FIGS. 2I-2L to obtain a shielded gate structure with the desired features and characteristics.

In accordance with the structure and method of the present invention, an improved IPD layer comprising a film stack of a thermally grown dielectric and a conformal deposited dielectric is obtained. The thermally grown dielectric provides a high quality dielectric and serves to round off the top corners of the shield electrode. The conformal deposited dielectric (1) fills in the gaps on the upper side of the shield electrode, (2) serves as a hard mask to protect the thermal dielectric over the shield electrode while the dielectric along the trench sidewalls is being etched, and (3) creates a smooth concave profile over which the gate electrode is formed. The rounded profile along the top surface of the shield electrode and the bottom of the gate electrode result in lower electric fields in these localized areas.

Further, the method of forming the IPD in accordance with the invention serves to decouple formation of the IPD from that of the gate oxide so that the IPD and gate dielectric can be independently optimized to, for example, achieve a thick, high quality IPD and a thin, high quality gate dielectric. In one embodiment, optimum transistor characteristics are obtained by using a ratio of IPD thickness to gate dielectric thickness of greater than about five to one. For example, an IPD thickness of greater than about 2,000 Å, and a gate dielectric thickness of less than about 400 Å is found to provide optimum transistor characteristics. The ability to form a thin gate dielectric can advantageously be used to achieve a lower on resistance.

The various structures and methods of the present invention may be combined with one or more of a number of charge spreading techniques as well as other shielded gate structures and manufacturing processes disclosed in the commonly assigned application Ser. No. 11/026,276, filed Dec. 29, 2004, and incorporated herein by reference in its entirety, to achieve an even lower on-resistance, higher blocking capability and higher efficiency, among other advantages and features.

Although a number of specific embodiments are shown and described above, embodiments of the invention are not limited thereto. For example, it is understood that the doping polarities of the structures shown and described could be reversed and/or the doping concentrations of the various elements could be altered without departing from the invention. The process sequence depicted by FIGS. 2A-2L is for forming an n-channel FET, however modifying this process sequence to form a p-channel FET would be obvious to one skilled in the art in view of this disclosure. Also, while the various embodiments described above are implemented in conventional silicon, these embodiments and their obvious variants can also be implemented in silicon carbide, gallium arsenide, gallium nitride, diamond or other semiconductor materials. Further, the cross-section views of the different embodiments may not be to scale, and as such are not intended to limit the possible variations in the layout design of the corresponding structures. Also, the FET shown and its obvious variants can be formed in stripe or cellular architecture including hexagonal or square shaped transistor cells. Moreover, the features of one or more embodiments of the invention may be combined with one or more features of other embodiments of the invention without departing from the scope of the invention. Hence, the scope of this invention should not be limited to the embodiments described, but are instead defined by the following claims.

What is claimed is:

1. A method of forming a field effect transistor, comprising:
   forming a trench in a silicon region of a first conductivity type;
   forming a shield electrode in a lower portion of the trench;
   forming an inter-poly dielectric (IPD) comprising a layer of thermal oxide and a layer of conformal dielectric along an upper surface of the shield electrode; and
   forming a gate electrode in the trench over the IPD.

2. The method of claim 1 wherein the IPD has a concave upper surface.

3. The method of claim 1 further comprising:
   forming a gate dielectric lining at least upper trench sidewalls, wherein a ratio of a thickness of the IPD to a thickness of the gate dielectric is greater than three to one.

4. The method of claim 1 further comprising:
   prior to forming the shield electrode, forming a shield dielectric lining trench sidewalls and bottom; and
   after forming the shield electrode, partially removing exposed portions of the shield dielectric such that a thin layer of the shield dielectric remains at least along upper trench sidewalls.

5. The method of claim 1 further comprising:
   forming a well region of a second conductivity type in the silicon region; and
   forming source regions in the well region such that the source regions flank the trench.

6. The method of claim 5 further comprising:
   forming an insulating layer extending over the gate electrode, the source regions and the well region;
   removing predefined portions of the insulating layer to expose corresponding surfaces of the well region;
   recessing the well region along the exposed surfaces such that sidewalls of source regions become exposed; and
   forming a metal layer to electrically contact the well region and the exposed sidewalls of the source regions.

7. The method of claim 1 wherein the step of forming an IPD comprises:
   forming a layer of thermal oxide along upper sidewalls of the trench and along an upper surface of the shield electrode;
   filling the trench with a conformal layer of dielectric; and
   partially removing the conformal layer of dielectric and the layer of thermal oxide such that the IPD comprising a remaining portion of the thermal dielectric layer and a remaining portion of the conformal layer of dielectric is formed.

8. The method of claim 7 wherein the step of forming a layer of thermal oxide comprises thermally oxidizing silicon such that a thicker layer of thermal oxide is formed along the upper surface of the shield dielectric than along the trench sidewalls.

9. The method of claim 7 wherein the partially removing step completely removes any dielectric along silicon surfaces adjacent the trench and along upper trench sidewalls.

10. The method of claim 7 wherein the filling step comprises depositing a conformal layer of oxide to fill the trench.

11. The method of claim 7 wherein the partially removing step comprises uniformly etching back the conformal layer of dielectric and the thermal oxide layer to a desired depth in the trench such that the remaining layer of conformal dielectric is surrounded by the remaining thermal oxide layer along a lower surface and sidewalls of the remaining layer of conformal dielectric.

12. A method of forming a field effect transistor (FET), the method comprising:
- forming a trench extending into a silicon region of a first conductivity type;
- forming a shield electrode in a lower portion of the trench; and
- forming an inter-poly dielectric (IPD) having a concave profile along at least a center portion of its upper surface over the shield electrode; and
- forming a gate electrode in the trench over the IPD.

13. The method of claim 12 wherein the shield electrode has a rounded top surface.

14. The method of claim 12 further comprising:
- prior to forming the shield electrode, forming a shield dielectric lining trench sidewalls and bottom; and
- after forming the shield electrode, partially removing exposed portions of the shield dielectric such that a thin layer of the shield dielectric remains at least along upper trench sidewalls.

15. The method of claim 12 further comprising:
- forming a well region of a second conductivity type in the silicon region; and
- forming source regions of the first conductivity in the well region, the source regions flanking the trench.

16. The method of claim 12 further comprising:
- forming a gate dielectric lining at least upper trench sidewalls, wherein a ratio of a thickness of the IPD to a thickness of the gate dielectric is greater than three to one.

17. The method of claim 12 wherein the step of forming an IPD comprises:
- forming a layer of thermal oxide along upper sidewalls of the trench and along an upper surface of the shield electrode;
- filling the trench with a conformal layer of dielectric; and
- partially removing the conformal layer of dielectric and the layer of thermal oxide such that the IPD comprising a remaining portion of the thermal dielectric layer and a remaining portion of the conformal layer of dielectric is formed.

18. The method of claim 17 wherein the step of forming a layer of thermal oxide comprises thermally oxidizing silicon such that a thicker layer of thermal oxide is formed along the upper surface of the shield dielectric than along the trench sidewalls.

19. The method of claim 17 wherein the partially removing step completely removes any dielectric along silicon surfaces adjacent the trench and along upper trench sidewalls.

20. The method of claim 17 wherein the filling step comprises depositing a conformal layer of oxide to fill the trench.

21. The method of claim 17 wherein the partially removing step comprises uniformly etching back the conformal layer of dielectric and the thermal oxide layer to a desired depth in the trench such that the remaining layer of conformal dielectric is surrounded by the remaining thermal oxide layer along a lower surface and sidewalls of the remaining layer of conformal dielectric.

22. A method of forming a field effect transistor (FET), the method comprising:
- forming a trench extending into a silicon region of a first conductivity type;
- forming a shield electrode in a lower portion of the trench; and
- forming an inter-poly dielectric (IPD) having a convex profile along its lower surface and a concave profile along its upper surface over the shield electrode; and
- forming a gate electrode in the trench over the IPD.

23. The method of claim 22 wherein the gate electrode has a concave profile along its lower surface.

24. The method of claim 22 wherein the shield electrode has a convex profile along its upper surface.

25. The method of claim 22 further comprising:
- a well region of a second conductivity type in the silicon region; and
- source regions of the first conductivity in the well region, the source regions flanking the trench.

26. The method of claim 22 further comprising:
- prior to forming the shield electrode, forming a shield dielectric lining trench sidewalls and bottom; and
- after forming the shield electrode, partially removing exposed portions of the shield dielectric such that a thin layer of the shield dielectric remains at least along upper trench sidewalls.

27. The method of claim 22 wherein the step of forming an IPD comprises:
- forming a layer of thermal oxide along upper sidewalls of the trench and along an upper surface of the shield electrode;
- filling the trench with a conformal layer of dielectric; and
- partially removing the conformal layer of dielectric and the layer of thermal oxide such that the IPD comprising a remaining portion of the thermal dielectric layer and a remaining portion of the conformal layer of dielectric is formed.

28. The method of claim 27 wherein the step of forming a layer of thermal oxide comprises thermally oxidizing silicon such that a thicker layer of thermal oxide is formed along the upper surface of the shield dielectric than along the trench sidewalls.

29. The method of claim 27 wherein the partially removing step completely removes any dielectric along silicon surfaces adjacent the trench and along upper trench sidewalls.

30. The method of claim 27 wherein the filling step comprises depositing a conformal layer of oxide to fill the trench.

31. The method of claim 27 wherein the partially removing step comprises uniformly etching back the conformal layer of dielectric and the thermal oxide layer to a desired depth in the trench such that the remaining layer of conformal dielectric is surrounded by the remaining thermal oxide layer along a lower surface and sidewalls of the remaining layer of conformal dielectric.

* * * * *